(12) United States Patent
Kim et al.

(10) Patent No.: US 12,266,457 B2
(45) Date of Patent: Apr. 1, 2025

(54) ORGANIC MAGNETIC MATERIAL AND SEMICONDUCTOR DEVICE INCLUDING THE SAME

(71) Applicant: GWANGJU INSTITUTE OF SCIENCE AND TECHNOLOGY, Gwangju (KR)

(72) Inventors: Dong-Yu Kim, Gwangju (KR); Yunseul Kim, Pohang-si (KR)

(73) Assignee: Gwangju Institute of Science and Technology, Gwangju (KR)

( * ) Notice: Subject to any disclaimer, the term of this patent is extended or adjusted under 35 U.S.C. 154(b) by 414 days.

(21) Appl. No.: 17/677,465

(22) Filed: Feb. 22, 2022

(65) Prior Publication Data

US 2023/0230736 A1 Jul. 20, 2023

(30) Foreign Application Priority Data

Dec. 7, 2021 (KR) .................. 10-2021-0173808
Feb. 10, 2022 (KR) .................. 10-2022-0017664

(51) Int. Cl.
*H01F 1/42* (2006.01)
*C08L 81/00* (2006.01)

(52) U.S. Cl.
CPC ............ *H01F 1/42* (2013.01); *C08L 81/00* (2013.01)

(58) Field of Classification Search
CPC . H01F 1/42; C08L 81/00; C08L 65/00; H10K 10/484; H10K 50/00; H10K 30/00;
(Continued)

(56) References Cited

U.S. PATENT DOCUMENTS 5,461,132 A 10/1995 Tabata et al.
2009/0156756 A1 6/2009 Alocilja et al.
(Continued)

FOREIGN PATENT DOCUMENTS

KR 10-2018-0001026 A 1/2018

OTHER PUBLICATIONS

Xuyang Wei et al., "Semiconducting Polymers Based on Isoindigo and Its Derivatives: Synthetic Tactics, Structural Modifications, and Applications," Advanced Functional Materials, 2021, pp. 1-33.
(Continued)

*Primary Examiner* — Stewart A Fraser
(74) *Attorney, Agent, or Firm* — Harness, Dickey & Pierce, P.L.C.

(57) ABSTRACT

Provided are an organic magnetic material and a semiconductor device including the same. According to the inventive concept, the organic magnetic material may include a material represented by Formula 1 below.

[Formula 1]

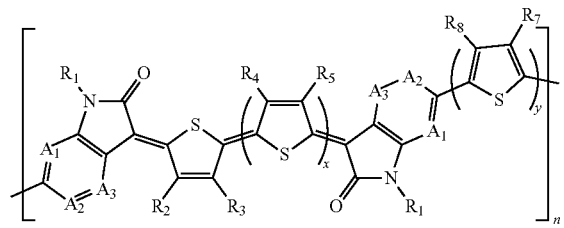

10 Claims, 12 Drawing Sheets

(58) Field of Classification Search
CPC ... C09D 165/00; C08G 61/126; C08G 61/123
See application file for complete search history.

(56) References Cited

U.S. PATENT DOCUMENTS

| | | | | |
|---|---|---|---|---|
| 2012/0248428 | A1* | 10/2012 | Yamashita | C07D 495/04 544/345 |
| 2019/0194385 | A1* | 6/2019 | Azoulay | C08G 61/123 |
| 2020/0362098 | A1 | 11/2020 | Azoulay et al. | |

OTHER PUBLICATIONS

Yunseul Kim et al., "pi-Conjugated Polymers Incorporating a Novel Planar Quinoid Buliding Block with Extended Delocalization and High Charge Carrier Mobility," Advanced Materials, 2018, pp. 1-9.

Alisson J. Santana et al., Magnetic Properties of a Polyfluorene Derivative Metallopolymer Containing Neodymium Ions, Macromol. Chem. Phys. 2021, 2100289.

Ryan C. Fortenberry, TheOldestMolecular Ancestor Finally Brought into the Light, Chem 2019, 5,1012.

Yunseul Kim et al., Open-Shell and Closed-Shell Quinoid-Aromatic Conjugated Polymers: Unusual Spin Magnetic and High Charge Transport Properties, ACS Appl. Mater. Interfaces 2021, 13, 2887-2898.

Javeed Mahmood et al., Organic Ferromagnetism: Trapping Spins in the Glassy State of an Organic Network Structure, Chem. 4, 2357-2369 (2018).

Seok Joon Yun et al., Ferromagnetic Order at Room Temperature in Monolayer WSe2 Semiconductor via Vanadium Dopant, Adv. Sci. 2020, 7.

* cited by examiner

ORGANIC MAGNETIC MATERIAL AND SEMICONDUCTOR DEVICE INCLUDING THE SAME

CROSS-REFERENCE TO RELATED APPLICATIONS

This U.S. non-provisional patent application claims priority under 35 U.S.C. § 119 of Korean Patent Application Nos. 10-2021-0173808, filed on Dec. 7, 2021 and 10-2022-0017664, filed Feb. 10, 2022, the entire contents of which are hereby incorporated by reference.

BACKGROUND

The present disclosure herein relates to an organic magnetic material, and more particularly, to an organic magnetic semiconductor material having ferromagnetic properties.

A quinoid structure may have two double bonds at ortho or para positions instead of one double bond in the ring of an aromatic compound. The quinoid structure has a specific conjugated double bond in the aromatic ring and may play the role of a strong chromophore, and most organic dyes (or pigments) may include the quinoid structure.

SUMMARY

The task for solving of the present disclosure is to provide an organic magnetic material having magnetic properties and semiconductor properties.

The task for solving of the present disclosure is not limited to the aforementioned tasks, and unreferred other tasks may be clearly understood by a person skilled in the art from the description below.

The inventive concept relates to an organic magnetic material. According to the inventive concept, the organic magnetic material may include a material represented by Formula 1 below.

[Formula 1]

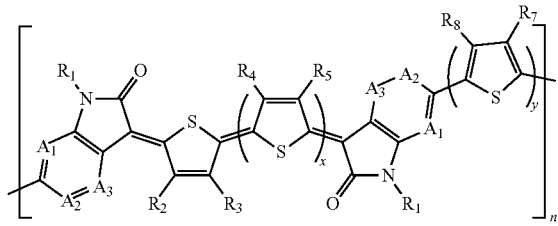

In Formula 1, $A_1$, $A_2$, and $A_3$ are each independently carbon or nitrogen, at least one of $A_1$, $A_2$, and $A_3$ is nitrogen, $R_1$ is hydrogen or an alkyl group of 1 to 50 carbon atoms, $R_2$, $R_3$, $R_4$, $R_5$, $R_6$, and $R_7$ are each independently hydrogen or an alkyl group of 1 to 3 carbon atoms, x is a rational number between 0 to 2, y is a rational number between 0 to 4, and n is an integer between 10 and 10000000.

In an embodiment, the material represented by Formula 1 may be ferromagnetic.

In an embodiment, in Formula 1, $A_1$ may be nitrogen.

In an embodiment, in Formula 1, $R_1$ may be an alkyl group of 5 to 50 carbon atoms.

In an embodiment, in Formula 1, x may be 1 or 2.

In an embodiment, in Formula 1, y may be 0 or 1.

In an embodiment, the material represented by Formula 1 may include a material represented by Formula 2 below.

[Formula 2]

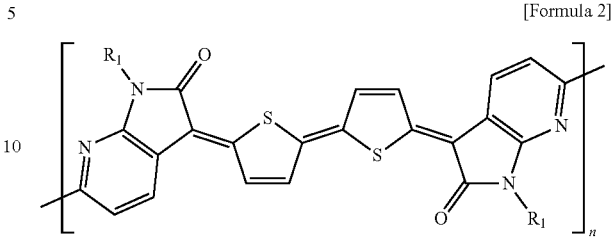

In Formula 2, $R_1$ is hydrogen or an alkyl group of 1 to 50 carbon atoms, and n is an integer between 10 and 10000000.

In an embodiment, the material represented by Formula 1 may include a material represented by Formula 3 below.

[Formula 3]

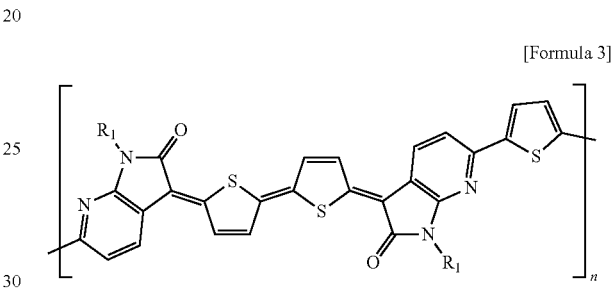

In Formula 3, $R_1$ is hydrogen or an alkyl group of 1 to 50 carbon atoms, and n is an integer between 10 and 10000000.

In an embodiment, the material represented by Formula 1 may be a semiconductor material.

According to the inventive concept, a semiconductor device may include: a substrate; source/drain patterns on the substrate; a semiconductor layer disposed between the source/drain patterns and including the above-described organic magnetic material; a gate pattern provided on the semiconductor layer and spaced apart from the semiconductor layer; and a gate insulating layer between the semiconductor layer and the gate pattern.

BRIEF DESCRIPTION OF THE FIGURES

The accompanying drawings are included to provide a further understanding of the inventive concept, and are incorporated in and constitute a part of this specification. The drawings illustrate example embodiments of the inventive concept and, together with the description, serve to explain principles of the inventive concept. In the drawings.

DETAILED DESCRIPTION

Figure 1:
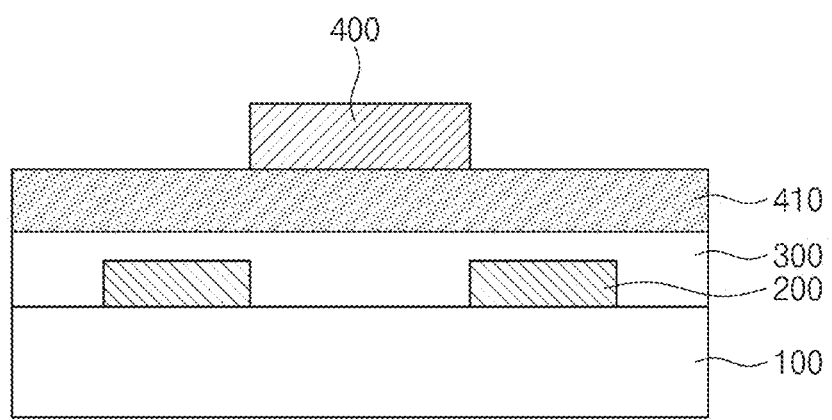
FIG. 1 is a diagram for explaining a semiconductor device according to embodiments.

Preferred embodiments of the inventive concept will be explained with reference to the accompany drawings for sufficient understanding of the configurations and effects of the inventive concept. The inventive concept may, however, be embodied in various forms, have various modifications and should not be construed as limited to the embodiments set forth herein. The embodiments are provided to complete the disclosure of the inventive concept through the explanation of the embodiments and to completely inform a person having ordinary knowledge in this technical field to which the inventive concept belongs of the scope of the inventive concept. A person having ordinary knowledge in this technical field might understand suitable environments in which the inventive concept may be performed.

In the disclosure, the terms used herein are to explain the embodiments but are not to limit the inventive concept. In the disclosure, the singular forms are intended to include the plural forms as well, unless the context clearly indicates otherwise. The terms "comprises" and/or "comprising," used in the disclosure, specify the presence of stated materials, elements, steps and/or devices, but do not preclude the presence or addition of one or more other materials, elements, steps and/or devices.

In the disclosure, it will be understood that when a film (or layer) is referred to as being on another film (or layer), it can be directly formed on the other film (or layer) or a substrate, or a third intervening film (or layer) may be present.

In various example embodiments in the disclosure, although the terms first, second, third, etc. may be used herein to describe various regions, films (or layers), etc., these regions and films should not be limited by these terms. These terms are only used to distinguish one region or film (or layer) from another region or film (or layer). Thus, a first layer material referred to in an embodiment could be termed a second layer material in another embodiment. Embodiments explained and illustrated herein may include their complementary embodiments. In the description, parts designated by the same reference numerals refer to the same configuration elements throughout.

In addition, example embodiments are described herein with reference to cross-sectional views and/or plan views that are schematic illustrations of idealized example embodiments. In the drawings, the thicknesses of layers and regions may be exaggerated for effective explanation of technical contents. As such, variations from the shapes of the illustrations as a result, for example, of manufacturing techniques and/or tolerances, are to be expected. Thus, example embodiments should not be construed as limited to the particular shapes illustrated herein but are to include deviations in shapes that result, for example, from manufacturing. For example, an etching region shown at right angles may have a rounded shape or a shape having a certain curvature. Thus, the regions illustrated in the drawings are schematic in nature and their shapes are not intended to illustrate the actual shape of a region of a device and are not intended to limit the scope of the present inventive concept.

In the disclosure, an alkyl group may be a linear alkyl group, a branched alkyl group, or a cyclic alkyl group. The carbon number of the alkyl group is not specifically limited, but the alkyl group may be an alkyl group of 1 to 50 carbon atoms. Examples of the alkyl group may include a methyl group, an ethyl group and a propyl group, without limitation. An aromatic ring compound may be a monocycle or a polycycle. The carbon number of the aromatic ring compound may be 5 to 50, without limitation. Examples of the aromatic ring compound may include a phenyl group, a biphenyl group, a naphthyl group, and/or a fluorenyl group, without limitation.

In the disclosure, the term "substituted or unsubstituted" corresponds to substituted or unsubstituted with one or more substituents selected from the group consisting of a hydrogen atom, a deuterium atom, a halogen atom, an ether group, a halogenated alkyl group, a halogenated alkoxy group, a halogenated ether group, an alkyl group, a cyano group, a cyano-substituted alkyl group, a cyano-substituted aryl group, a cyano-substituted aromatic ring group, and a hydrocarbon ring group. In addition, each of the example substituents illustrated may be substituted or unsubstituted. For example, a biphenyl group may be interpreted as an aryl group, or a phenyl group substituted with a phenyl group.

In the chemical formulae in the disclosure, in the case where a chemical bond is not drawn where a chemical bond is required, it may mean that a hydrogen atom is bonded at that position, unless otherwise defined.

In the disclosure, same reference symbols may refer to the same constituent elements throughout the text.

Hereinafter, an organic magnetic material according to the inventive concept will be explained.

According to embodiments, the organic magnetic material may be an organic magnetic semiconductor material. The organic magnetic semiconductor material may be a polymer. The organic magnetic semiconductor material may be represented by Formula 1 below.

[Formula 1]

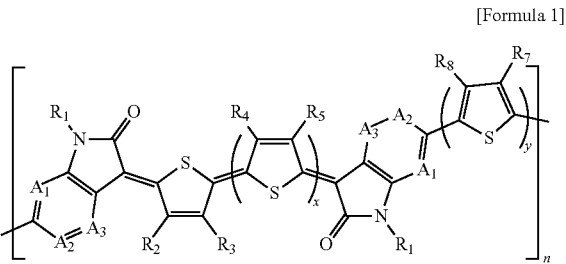

In Formula 1, $A_1$, $A_2$, and $A_3$ are each independently carbon or nitrogen, at least one of $A_1$, $A_2$, and $A_3$ is nitrogen, $R_1$ is hydrogen or an alkyl group of 1 to 50 carbon atoms, $R_2$, $R_3$, $R_4$, $R_5$, $R_6$, and $R_7$ are each independently hydrogen or an alkyl group of 1 to 3 carbon atoms, x is a rational number between 0 and 2, y is a rational number between 0 and 4, and n is an integer between 10 and 10000000.

According to an embodiment, in Formula 1, x may be 1 or 2.

According to an embodiment, in Formula 1, y may be 0 or 1.

According to an embodiment, in Formula 1, $R_1$ may be an alkyl group of 5 to 50 carbon atoms.

For example, the material represented by Formula 1 may include, for example, a material represented by Formula 2 and/or a material represented by Formula 3 below.

[Formula 2]

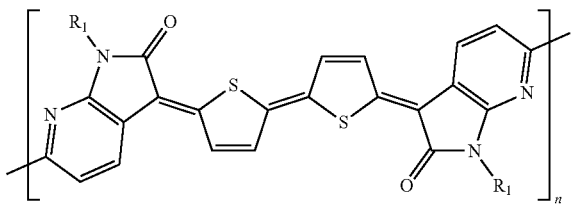

In Formula 2, $R_1$ is hydrogen or an alkyl group of 1 to 50 carbon atoms, and n is an integer between 10 and 10000000.

The material represented by Formula 2 may include, for example, a material represented by Formula 2A below.

[Formula 2A]

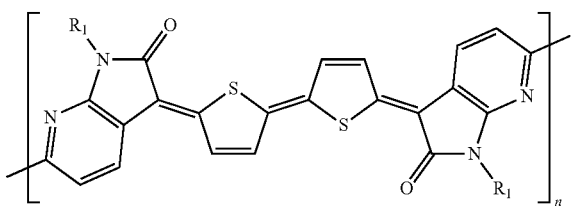

In Formula 2A, $R_1$ is 2-decyltetradecyl, and n is an integer between 10 and 10000000.

[Formula 3]

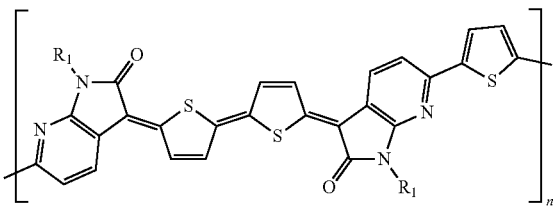

In Formula 3, $R_1$ is hydrogen or an alkyl group of 1 to 50 carbon atoms, and n is an integer between 10 and 10000000.

The material represented by Formula 3 may include, for example, a material represented by Formula 3A below.

[Formula 3A]

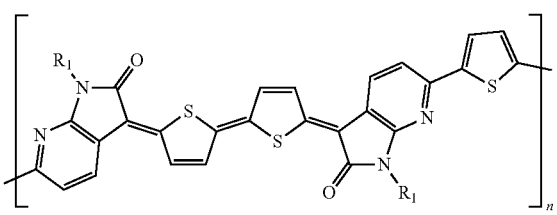

In Formula 3A, $R_1$ is 2-decyltetradecyl, and n is an integer between 10 and 10000000.

The organic magnetic semiconductor material may have an open-shell diradical structure. If a material has an open-shell structure, it may mean that the valence shell of the material may be incompletely filled up with electrons. For example, the valence shell of the organic magnetic semiconductor material may be incompletely filled up with electrons, or may have at least two unpaired electrons. The at least two unpaired electrons may be diradicals or polyradicals.

The organic magnetic semiconductor material may have a resonance structure. For example, the material represented by Formula 3 may have a resonance structure as Formula 3B below.

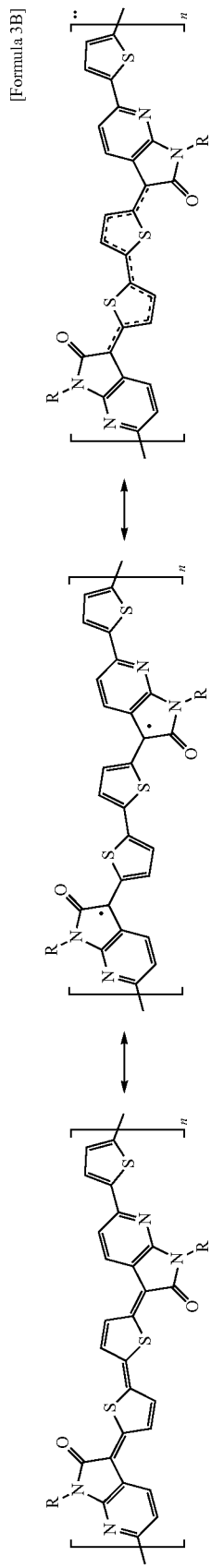
[Formula 3B]

In Formula 3B, $R_1$ is hydrogen or an alkyl group of 1 to 50 carbon atoms, and n is an integer between 10 and 10000000.

Generally, diradicals are unstable and may be difficult to form. According to embodiments, the organic magnetic semiconductor material has a resonance structure, and the diradicals of the organic magnetic semiconductor material may be stabilized. The organic magnetic semiconductor material may have spin properties. According to embodiments, a high spin density of the organic magnetic semiconductor material may be stabilized by the resonance stabilization. Accordingly, the organic magnetic semiconductor material may show magnetic properties. In an embodiment, the organic magnetic semiconductor material may show ferromagnetic properties. In another embodiment, the organic magnetic semiconductor material may show paramagnetic or diamagnetic properties.

The organic magnetic semiconductor material may be a polymer including a heterocyclic compound. For example, in Formula 1, at least one of $A_1$, $A_2$, and $A_3$ may be nitrogen. The nitrogen may be positioned in an aromatic ring structure to contribute to the resonance stabilization. Accordingly, the diradicals and high spin density of the organic magnetic semiconductor material may be stabilized further. For example, $A_1$ in Formula 1 may be nitrogen. In this case, the spin density and diradicals of the organic magnetic semiconductor material may be stabilized further. Since the spin density and radicals of the organic magnetic semiconductor material are stabilized, the organic magnetic semiconductor material may show ferromagnetic properties.

FIG. 1 is a diagram for explaining a semiconductor device according to embodiments.

Referring to FIG. 1, a semiconductor device may be a transistor. The semiconductor device may include a substrate 100, source/drain patterns 200, a gate pattern 400, and a semiconductor layer 300. The substrate 100 may be a semiconductor substrate, a glass substrate, or a polymer substrate. The source/drain patterns 200 may be disposed on the substrate 100. The source/drain patterns 200 may be disposed with a gap to the side. The source/drain patterns 200 may include a conductive material such as a metal and a doped semiconductor material.

The semiconductor layer 300 may be provided on the substrate 100 and disposed between the source/drain patterns 200. The semiconductor layer 300 may be an active layer. The semiconductor layer 300 may include the above-described organic magnetic semiconductor material. For example, the semiconductor layer 300 may include the material represented by Formula 1.

The gate pattern 400 may be provided on the semiconductor layer 300 and spaced from the semiconductor layer 300. The gate pattern 400 may be spaced from the source/drain patterns 200. The gate pattern 400 may include a conductive material such as a metal and a doped semiconductor material. The semiconductor device may further include a gate insulating layer 410. The gate insulating layer 410 may be disposed between the semiconductor layer 300 and the gate pattern 400. The gate insulating layer 410 may include silicon oxide, silicon nitride, silicon oxynitride, or a high dielectric material.

The structure of a transistor may be variously changed without limitation to the drawing. The positions of the source/drain patterns 200, semiconductor layer 300, gate insulating layer 410, and gate pattern 400 may be diversely changed. For example, the transistor may have a bottom gate structure. In this case, the gate pattern 400, the gate insulating layer 410, and the semiconductor layer 300 may be sequentially stacked on the substrate 100. The gate pattern 400 may be disposed between the substrate 100 and the gate insulating layer 410. The semiconductor layer 300 may be provided between the source/drain patterns 200.

Different from the drawing, the semiconductor layer 300, gate insulating layer 410, and gate pattern 400 may be buried in the substrate 100.

The organic magnetic semiconductor material according to embodiments may show ferromagnetic properties and semiconductor properties at the same time. The organic magnetic semiconductor material may show ferromagnetic properties at room temperature (about 300K). Accordingly, the organic magnetic semiconductor material may be applied to spintronics.

According to embodiments, the organic magnetic semiconductor material may be used in spintronics such as a spin memory, a spin transistor, a spin organic light emitting diode (OLED) and a spin solar cell and/or a magnetic conductive film.

Hereinafter, referring to experimental examples of the inventive concept and comparative examples, organic magnetic semiconductor materials and the property evaluation of the organic magnetic semiconductor materials will be explained.

1. Preparation of Organic Material

Comparative Example 1

A material represented by Formula 4 below was prepared.

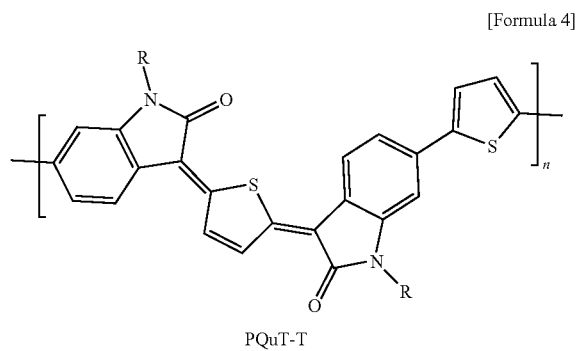

[Formula 4]

PQuT-T

In Formula 4, R is 2-decyltetradecyl, and n is an integer between 10 and 10000000.

Experimental Example 1

A material represented by Formula 2A was synthesized by performing the reaction represented by Reaction 1A.

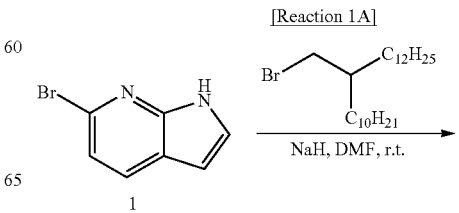

[Reaction 1A]

-continued

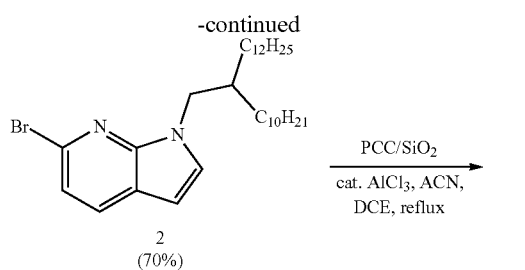

2
(70%)

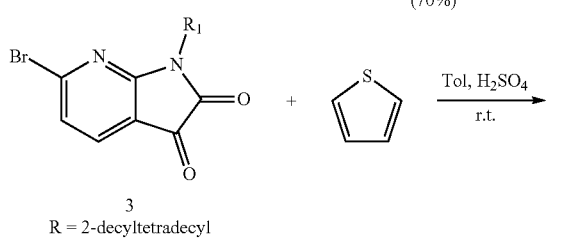

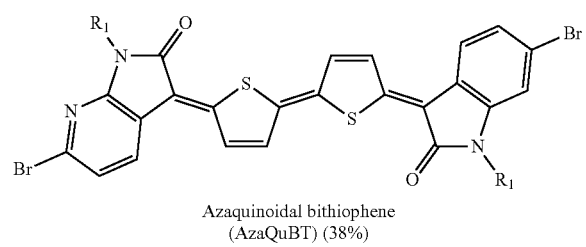

Azaquinoidal bithiophene
(AzaQuBT) (38%)

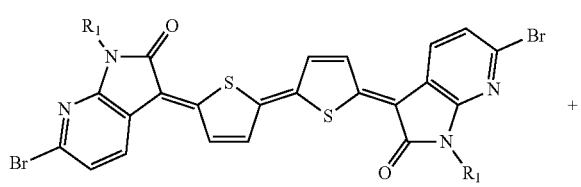

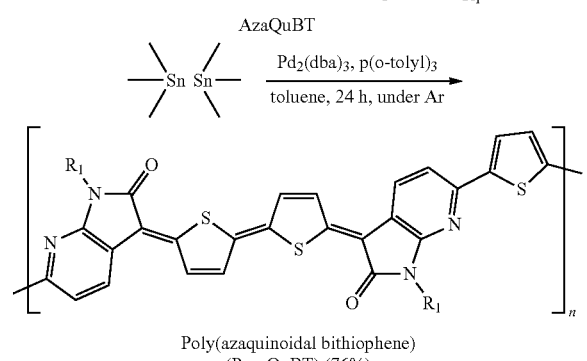

Poly(azaquinoidal bithiophene)
(PazaQuBT) (76%)

In Reaction 1A, $R_1$ is 2-decyltetradecyl, and n is an integer between 10 and 10000000.

[Yield analysis] A final product was 337 mg. The yield was calculated as 76%.

Experimental Example 2

A material represented by Formula 3A was synthesized by performing the reaction represented by Reaction 1B.

[Reaction 1B]

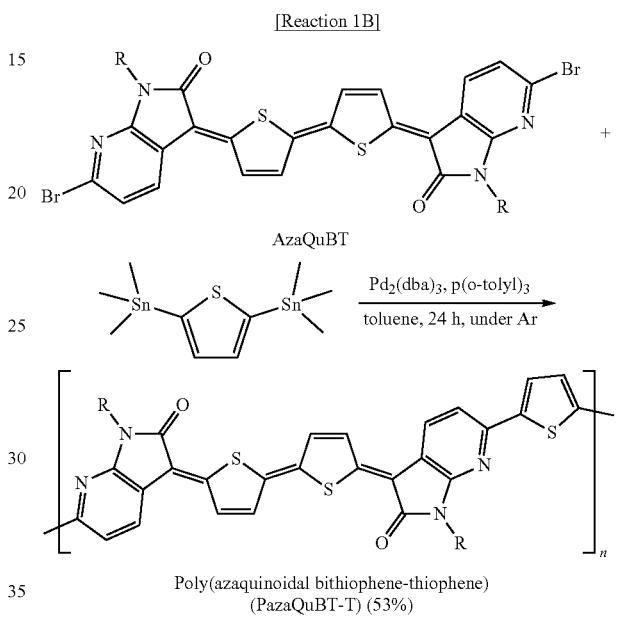

Poly(azaquinoidal bithiophene-thiophene)
(PazaQuBT-T) (53%)

In Reaction 1B, R is 2-decyltetradecyl, and n is an integer between 10 and 10000000.

[Yield analysis] A final product was 250 mg. The yield was calculated as 53%.

Comparative Example A

A material represented by Formula A below was prepared

[Formula A]

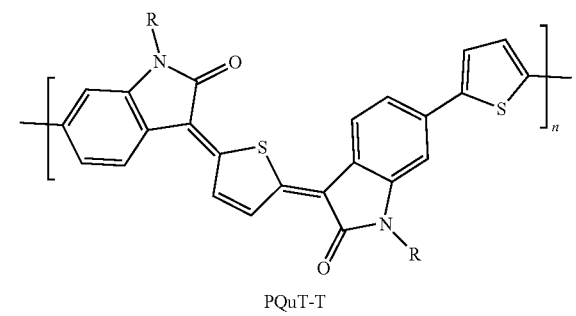

PQuT-T

In Formula A, R is 2-decyltetradecyl, and n is an integer between 10 and 10000000.

Comparative Example B

A material represented by Formula B below was prepared

[Formula B]

R = n-dodecyl

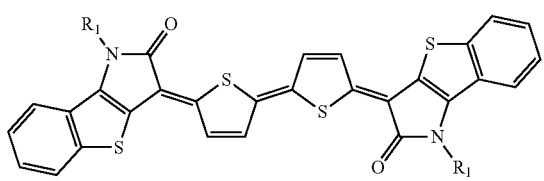

2. Measurement of Variable Temperature Electron Paramagnetic Resonance (VT-EPR)

The variable temperature electron paramagnetic resonance (VT-EPR) of the materials of Comparative Example 1, Experimental Example 1 and Experimental Example 2 was measured. The measurement of the electron paramagnetic resonance was conducted under conditions of a frequency of about 9.64 GHz, a power of about 1 mW, a modulation frequency of about 100 kHz and a modulation amplitude of about 10 G. The electron paramagnetic resonance was measured under temperature conditions of 10K, 20K, 30K, 40K, and 50K, each.

3. Analysis of Magnetic Property Measurement System (MPMS)

The magnetic properties of the materials of Comparative Example A, Comparative Example B, and Experimental Example 2 were evaluated using a magnetic property measurement system (MPMS). The evaluation of the magnetic properties of Comparative Example A was performed under temperature conditions of 2K and 300K. The evaluation of the magnetic properties of Comparative Example B was performed under temperature conditions of 20K and 300K. The evaluation of the magnetic properties of Experimental Example 2 was performed under temperature conditions of 5K and 300K.

4. Manufacture and Property Evaluation of Transistor

Experimental Example 1A

Source/drain electrodes were formed on a substrate. Between the source/drain electrodes, an active layer was formed using the material of Experimental Example 1. On the active layer, a gate insulating layer was formed. On the gate insulating layer, a gate electrode was formed. The properties of the transistor were evaluated at a temperature of about 250° C.

Experimental Example 2A

A transistor was manufactured by the same method as Experimental Example 1A. However, an active layer was formed using the material of Experimental Example 2. The properties of the transistor were evaluated at a temperature of about 250° C.

Figure 2A:
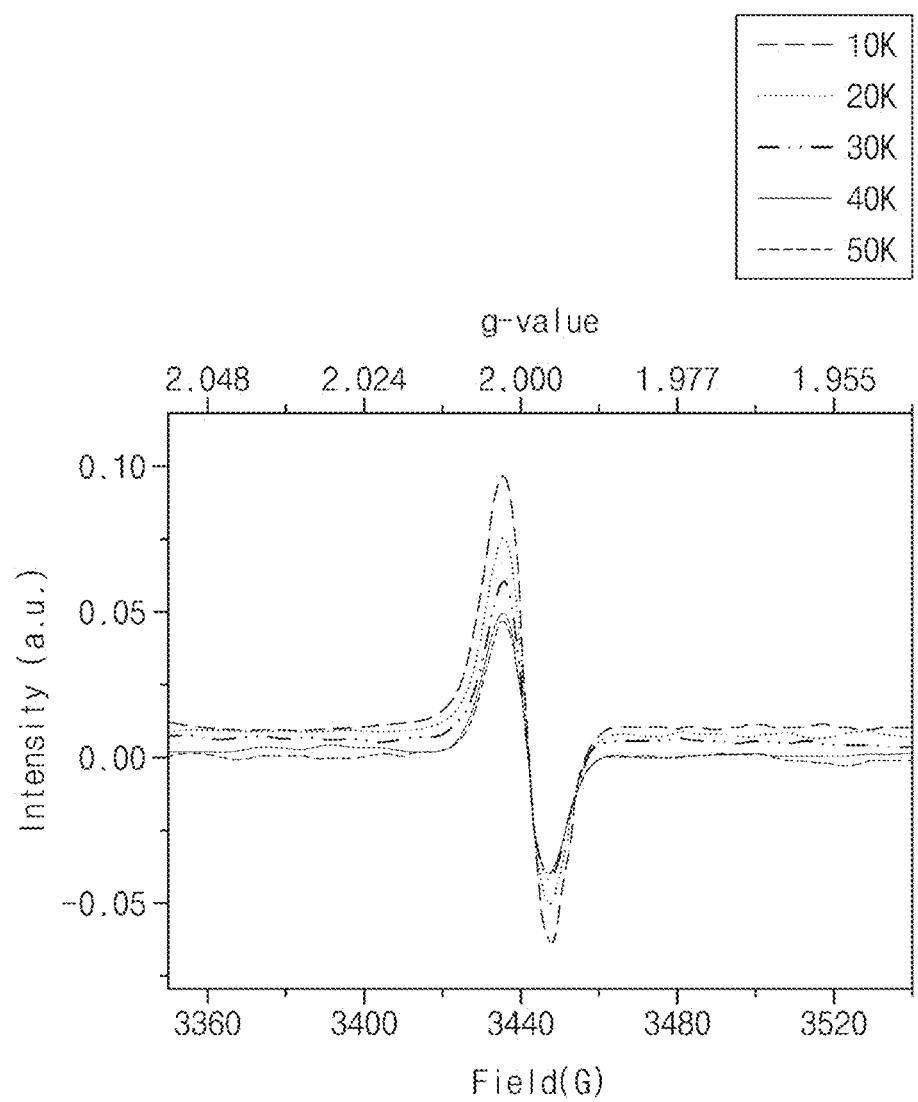
FIG. 2A is a graph showing measurement results of variable temperature electron paramagnetic resonance (VT-EPR) of Comparative Example 1.
Figure 2B:
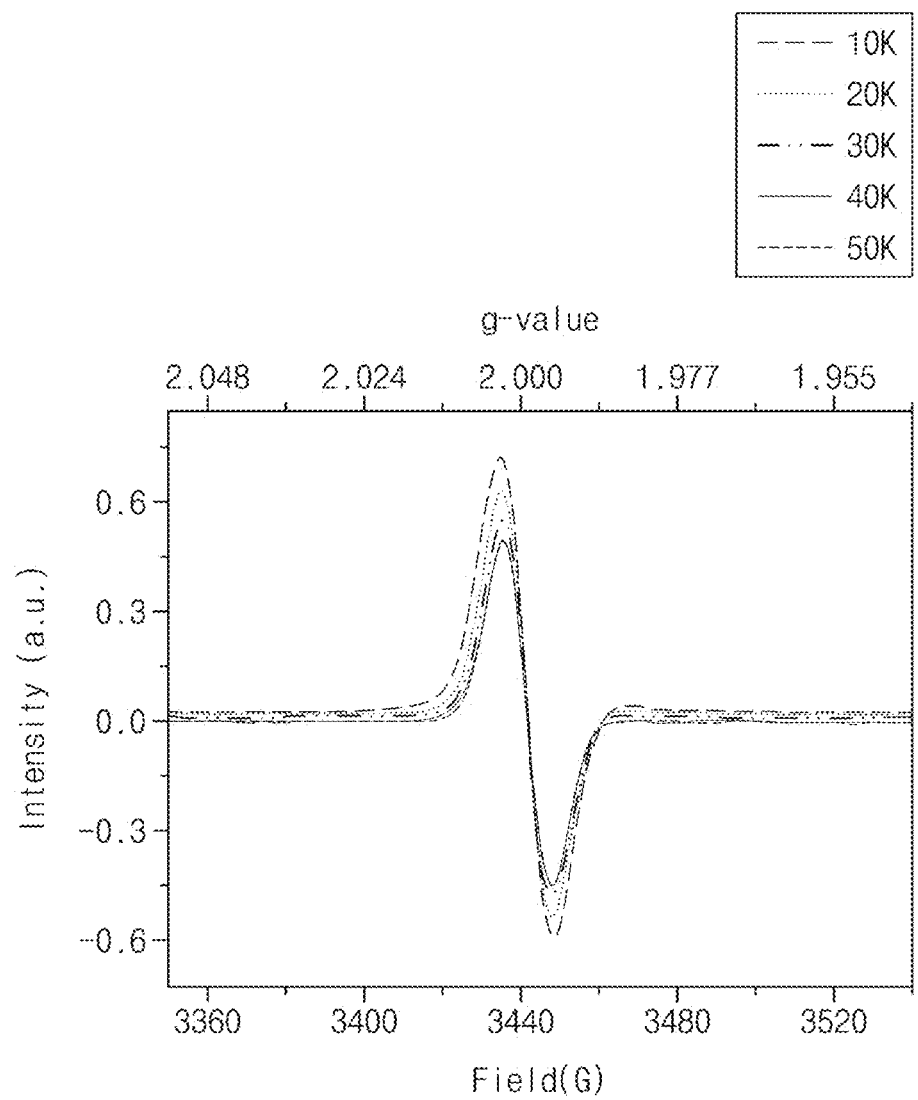
FIG. 2B is a graph showing measurement results of variable temperature electron paramagnetic resonance (VT-EPR) of Experimental Example 1.
Figure 2C:
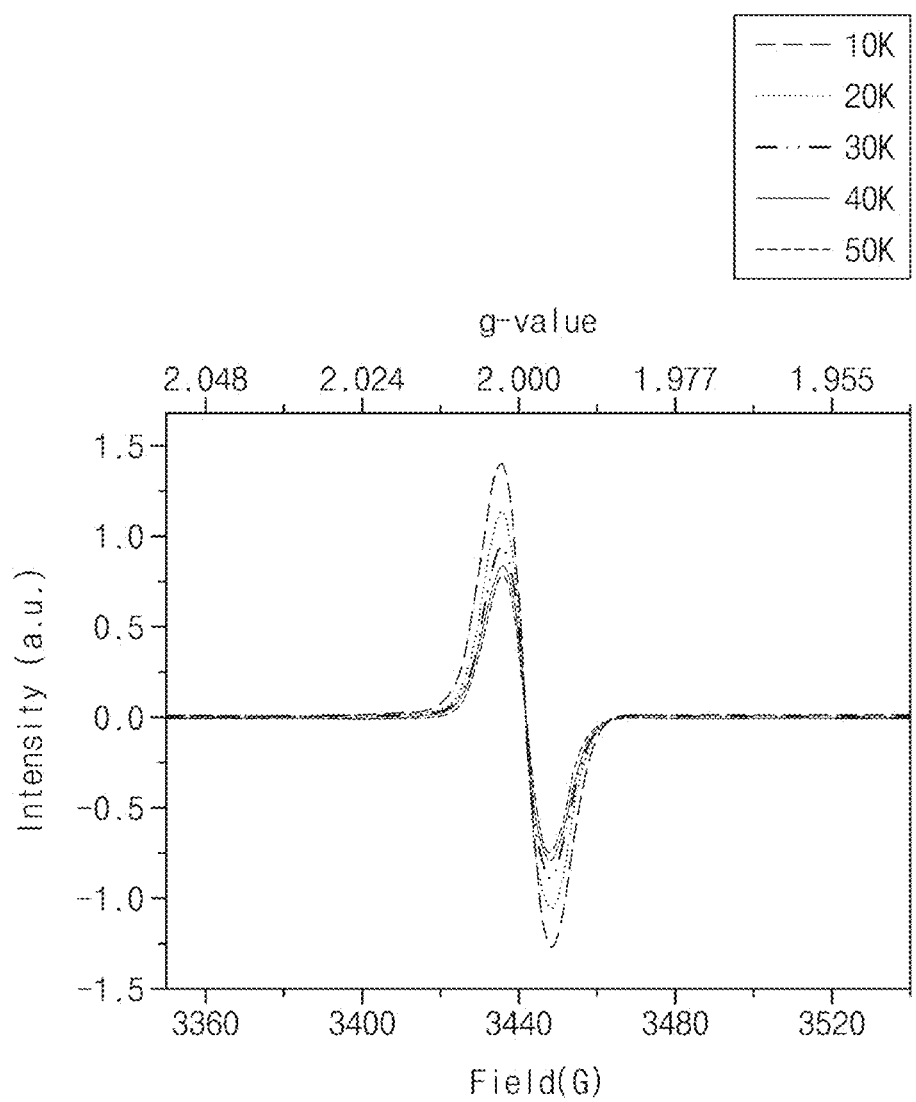
FIG. 2C is a graph showing measurement results of variable temperature electron paramagnetic resonance (VT-EPR) of Experimental Example 2.

FIG. 2A is a graph showing measurement results of variable temperature electron paramagnetic resonance (VT-EPR) of Comparative Example 1. FIG. 2B is a graph showing measurement results of variable temperature electron paramagnetic resonance (VT-EPR) of Experimental Example 1. FIG. 2C is a graph showing measurement results of variable temperature electron paramagnetic resonance (VT-EPR) of Experimental Example 2.

Referring to FIG. 2A, FIG. 2B, and FIG. 2C, it was observed that the materials of Comparative Example 1, Experimental Example 1, and Experimental Example 2 had radicals. The intensity of Experimental Example 1 and Experimental Example 2 may be greater than the intensity of Comparative Example 1. The radical concentration of Experimental Example 1 and Experimental Example 2 may be greater than the radical concentration of Comparative Example 1. The spin density of Experimental Example 1 and Experimental Example 2 may be greater than the spin density of Comparative Example 1.

According to the Examples, Experimental Example 1 and Experimental Example 2 may have a heterocycle structure. Accordingly, Experimental Example 1 and Experimental Example 2 may have markedly high radical concentration and spin density. The radicals of Experimental Example 1 and Experimental Example 2 may be stabilized.

Figure 3A:
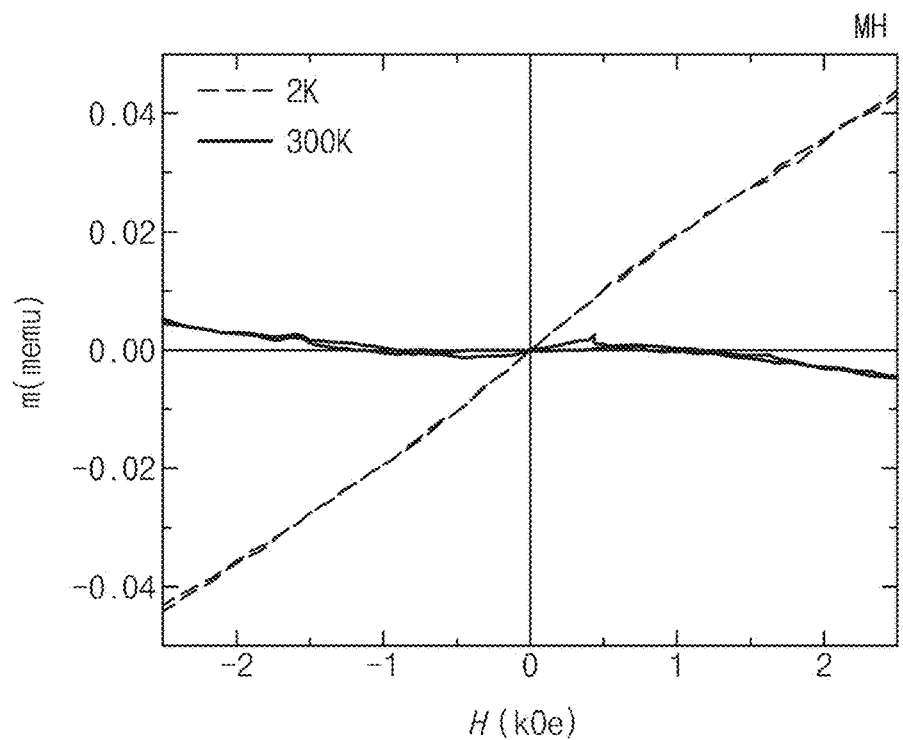
FIG. 3A shows evaluation results of magnetic properties of Comparative Example A using a magnetic property measurement system (MPMS) under temperature conditions of 2K and 300K.

FIG. 3A shows evaluation results of the magnetic properties of Comparative Example A using a magnetic property measurement system (MPMS) under temperature conditions of 2K and 300K and shows magnetization (m) according to magnetic direction and intensity (H).

Referring to FIG. 3A, Comparative Example A has a positive value the slope of the graph under temperature conditions of 2K. The material of Comparative Example A, represented by Formula A may show paramagnetic properties under temperature conditions of 2K. Comparative Example A has a negative value of the slope of the graph under temperature conditions of 300K. The material of Comparative Example A, represented by Formula A may show diamagnetic properties under temperature conditions of 300K.

Figure 3B:
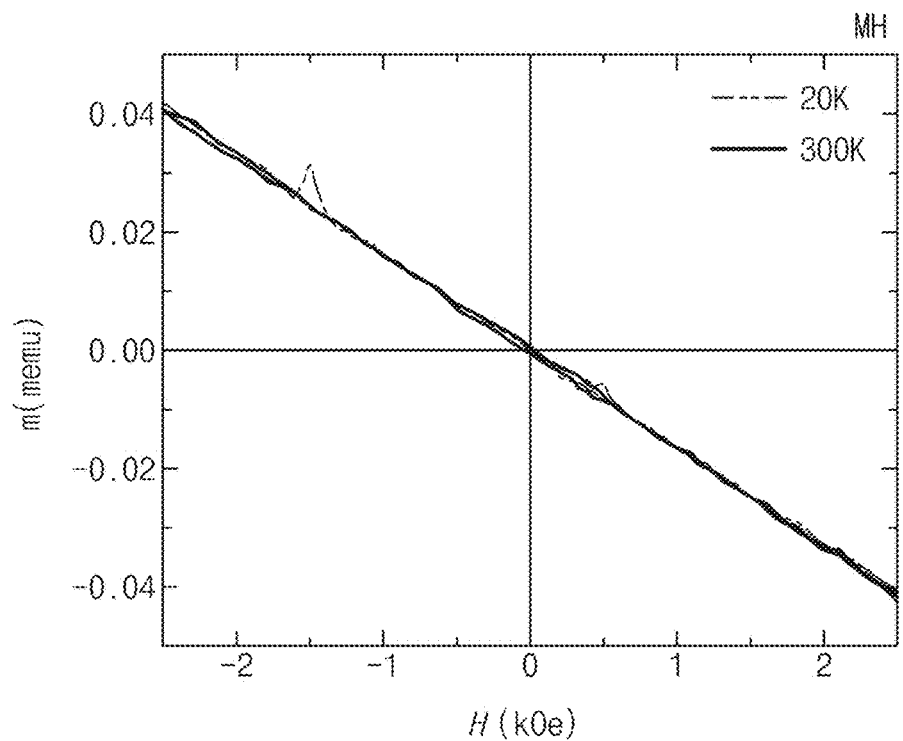
FIG. 3B shows evaluation results of magnetic properties of Comparative Example B using a magnetic property measurement system of 20K and 300K.

FIG. 3B shows evaluation results of the magnetic properties of Comparative Example B using a magnetic property measurement system under temperature conditions of 20K and 300K and shows magnetization (m) according to magnetic direction and intensity (H).

Referring to FIG. 3B, Comparative Example B has a negative value of the slope of the graph under temperature conditions of 20K and 300K. The material of Comparative Example B, represented by Formula B may show diamagnetic properties under temperature conditions of 20K and 300K.

Figure 3C:
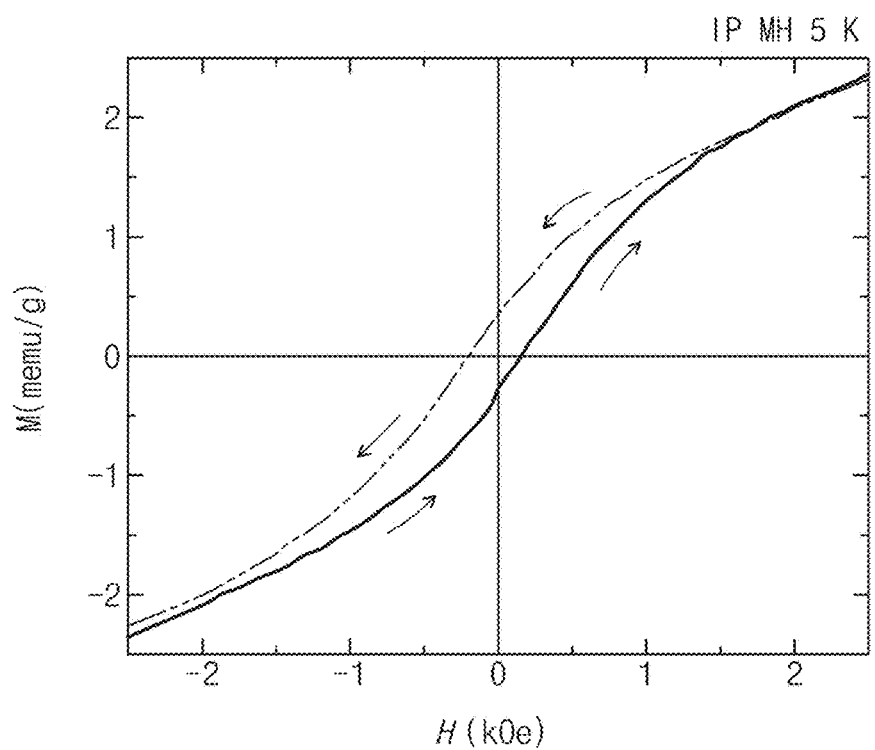
FIG. 3C shows evaluation results of magnetic properties of Experimental Example 2 using a magnetic property measurement system under temperature conditions of 5K.

FIG. 3C shows evaluation results of the magnetic properties of Experimental Example 2 using a magnetic property measurement system under temperature conditions of 5K and shows saturation magnetization (M) according to magnetic direction and intensity (H).

Referring to FIG. 3C, in the case of Experimental Example 2, a hysteresis loop was observed under temperature conditions of 5K. The graph curve of Experimental Example 2 has a negative value of the slope. Experimental Example 2 shows a saturation magnetization value of $2.0 \times 10^{-3}$ emu (2.0 memu) under temperature conditions of 5K. The material represented by Formula 2A, used in Experimental Example 2 may show ferromagnetic properties under temperature conditions of 5K.

Figure 3D:
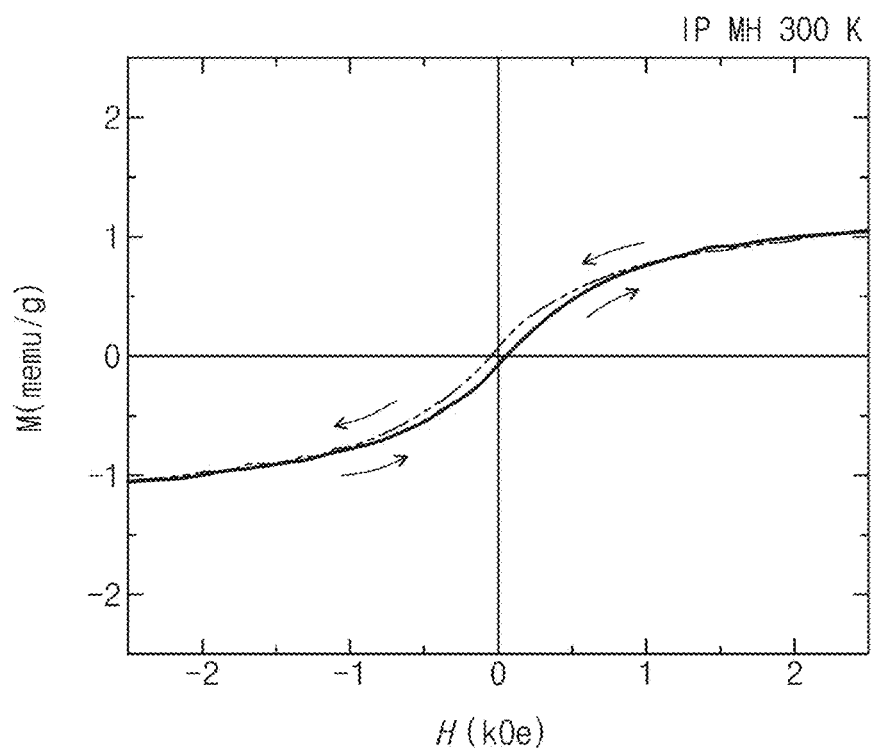
FIG. 3D shows evaluation results of magnetic properties of Experimental Example 2 using a magnetic property measurement system under temperature conditions of 300K.

FIG. 3D shows evaluation results of the magnetic properties of Experimental Example 2 using a magnetic property measurement system under temperature conditions of 300K and shows saturation magnetization (M) according to magnetic direction and intensity (H).

Referring to FIG. 3D, in the case of Experimental Example 2, the graph has a negative value of the slope under temperature conditions of 300K. In addition, a hysteresis loop was observed. Experimental Example 2 shows a saturation magnetization value of $0.8 \times 10^{-3}$ emu (0.8 memu) under temperature conditions of 300K. The material represented by Formula 3A, used in Experimental Example 2 may show ferromagnetic properties under temperature conditions of 300K.

Figure 4A:
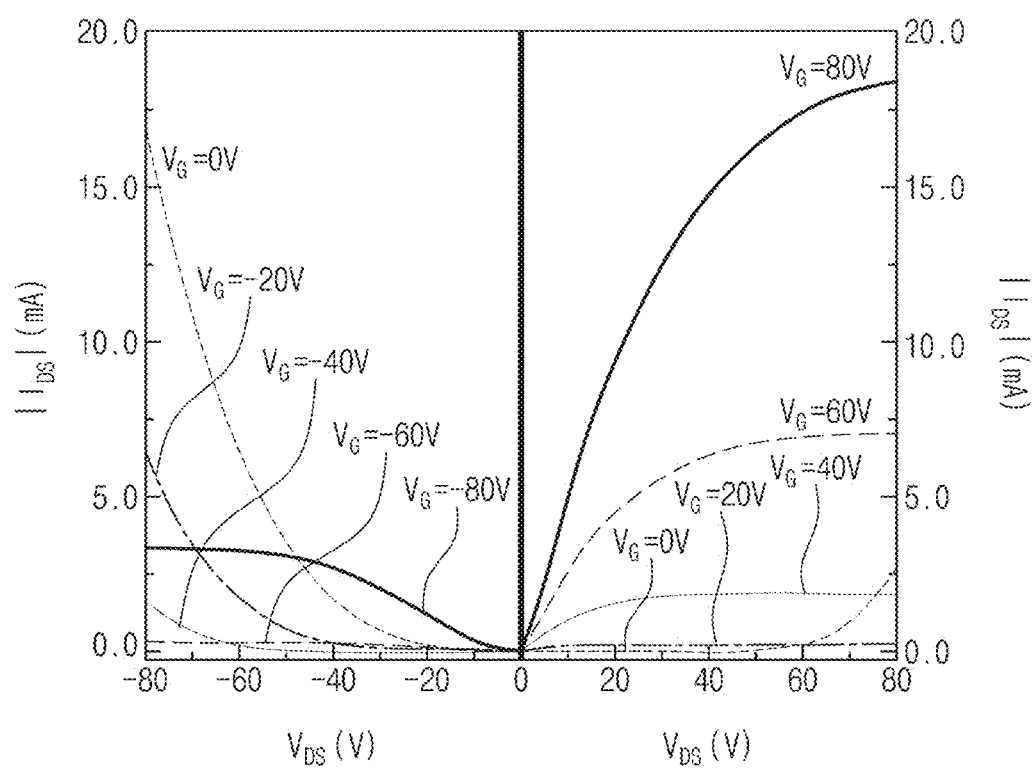
FIG. 4A is an output graph of a transistor of Experimental Example 1A.

FIG. 4A is an output graph of a transistor of Experimental Example 1A, and shows measured results of the absolute value of output current ($I_{DS}$) according to a drain voltage ($V_{DS}$). The gate voltage ($V_G$) was measured under conditions of −80 V, −60 V, −40 V, −20 V, 0 V, 20 V, 40 V, 60 V, and 80 V each.

Figure 4B:
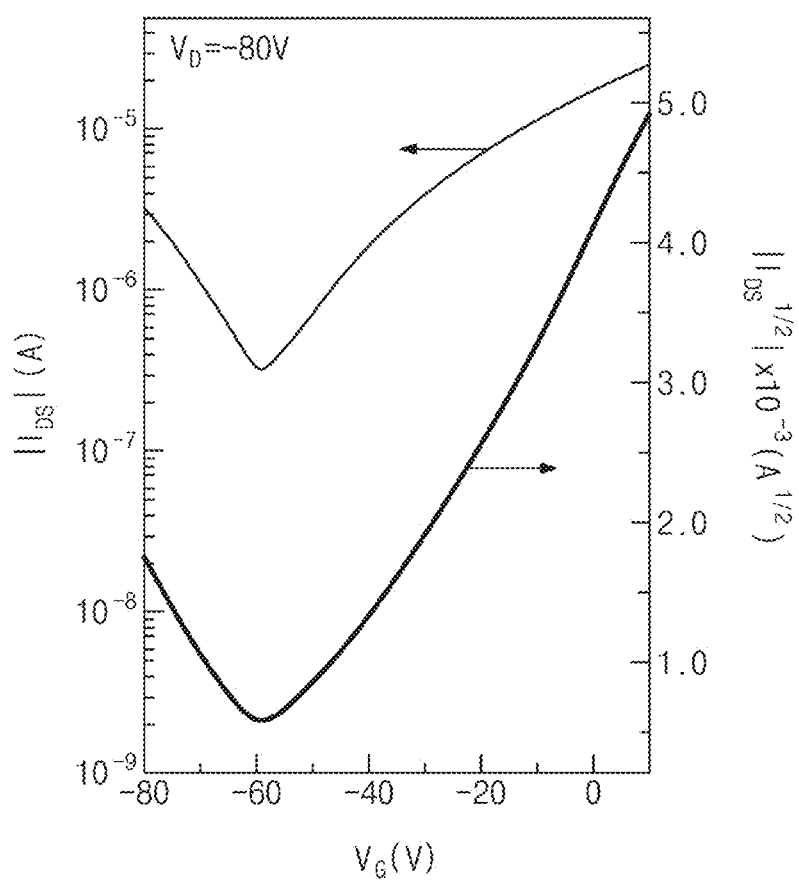
FIG. 4B is a transfer curve graph of a transistor of Experimental Example 1A and shows measured results under voltage drop ($V_D$) conditions of about −80 V.
Figure 4C:
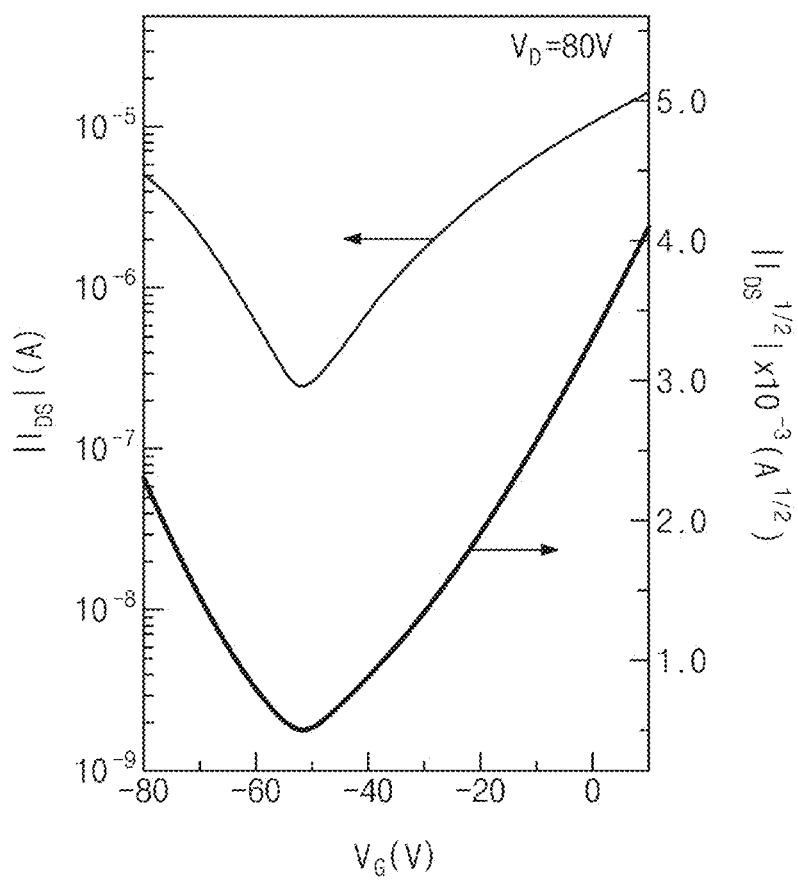
FIG. 4C is a transfer curve graph of a transistor of Experimental Example 1A and shows measured results under voltage drop ($V_D$) conditions of about 80 V.

FIG. 4B is a transfer curve graph of a transistor of Experimental Example 1A and shows the absolute value of an output current ($I_{DS}$) according to a gate voltage ($V_G$) under voltage drop ($V_D$) conditions of −80 V, and the absolute value of the square root of the output current. FIG. 4C is a transfer curve graph of a transistor of Experimental Example 1A and shows the absolute value of an output current ($I_{DS}$) according to a gate voltage ($V_G$) under voltage drop ($V_D$) conditions of 80 V, and the absolute value of the square root of the output current.

Figure 5A:
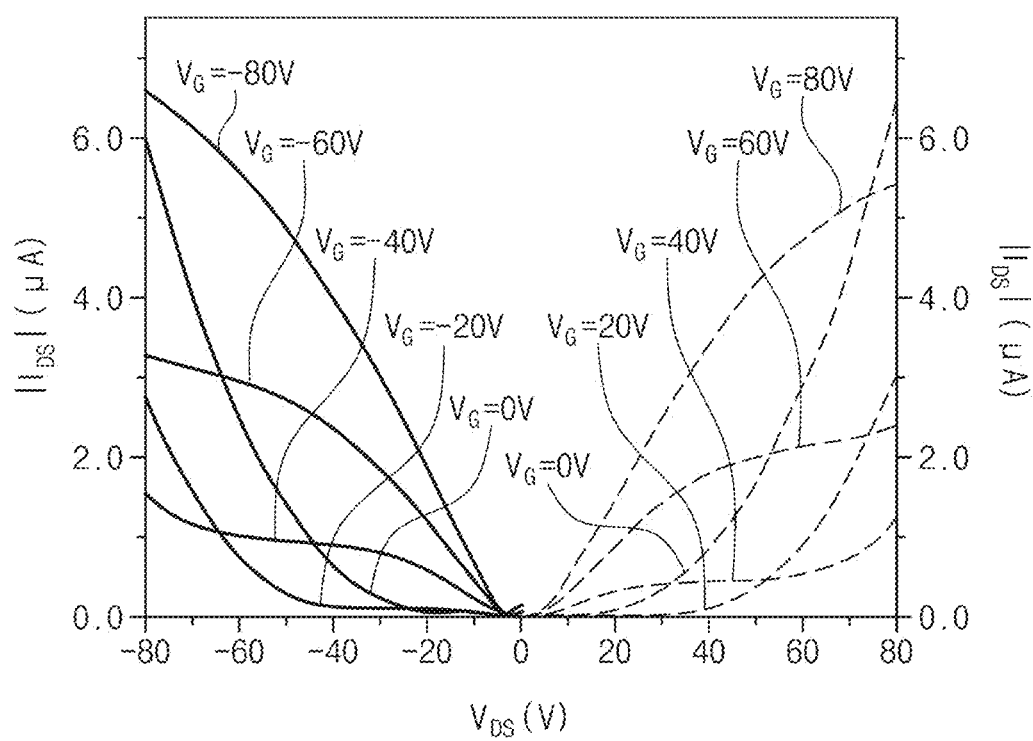
FIG. 5A is an output graph of a transistor of Experimental Example 1B.

FIG. 5A is an output graph of a transistor of Experimental Example 1B and shows measured results of the absolute value of an output current ($I_{DS}$) according to a drain voltage ($V_D$). The gate voltage ($V_G$) was measured under conditions of −80 V, −60 V, −40 V, −20 V, 0 V, 20 V, 40 V, 60 V, and 80 V each.

Figure 5B:
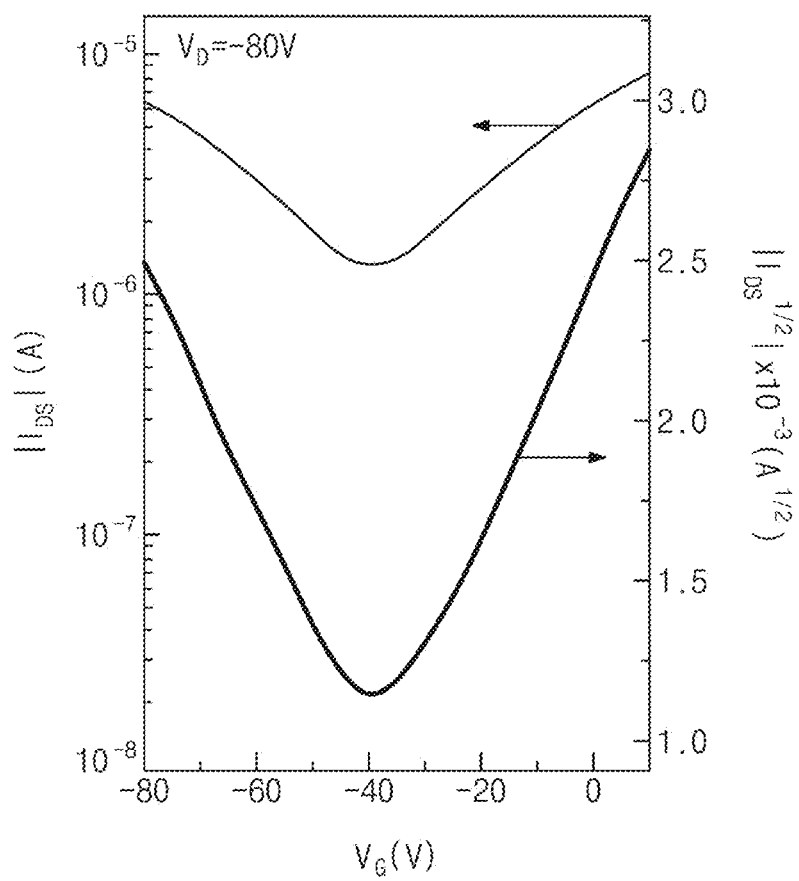
FIG. 5B is a transfer curve graph of a transistor of Experimental Example 1B and shows measured results under voltage drop ($V_D$) conditions of about −80 V.
Figure 5C:
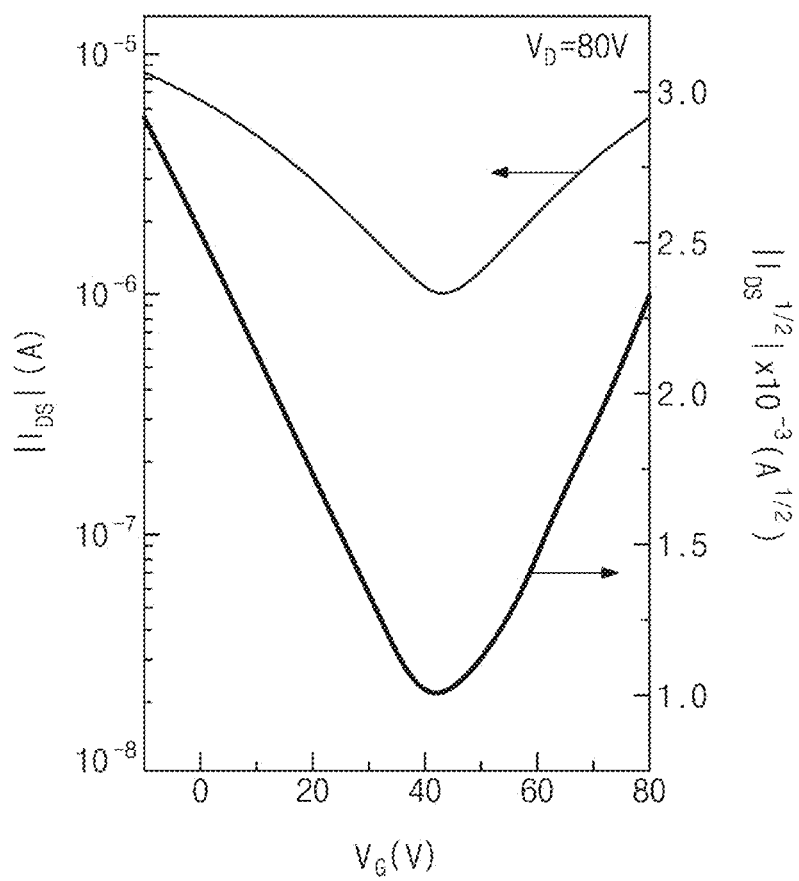
FIG. 5C is a transfer curve graph of a transistor of Experimental Example 1B and shows measured results under voltage drop ($V_D$) conditions of about 80 V.

FIG. 5B is a transfer curve graph of a transistor of Experimental Example 1B and shows the absolute value of an output current ($I_{DS}$) according to a gate voltage ($V_G$) under voltage drop ($V_D$) conditions of −80 V, and the absolute value of the square root of the output current. FIG. 5C is a transfer curve graph of a transistor of Experimental Example 1B and shows the absolute value of an output current ($I_{DS}$) according to a gate voltage ($V_G$) under voltage drop ($V_D$) conditions of 80 V, and the absolute value of the square root of the output current.

Table 1 shows evaluation results of the transistors of Experimental Example 1A and Experimental Example 1B.

TABLE 1

| | Hole | | | Electron | | |
|---|---|---|---|---|---|---|
| | Average mobility (cm²/Vs) | Threshold voltage (V) | $I_{on}/I_{off}$ ratio | Average mobility (cm²/Vs) | Threshold voltage (V) | $I_{on}/I_{off}$ ratio |
| Experimental Example 1 | $3.05 \times 10^{-2}$ | −57.8 | $10^1$ | $3.41 \times 10^{-2}$ | 30.5 | $10^2$ |
| Experimental Example 2 | 0.29 | −40.0 | $10^0$ | 0.41 | 31.5 | $10^1$ |

Referring to Table 1, FIG. 4A, FIG. 4B, FIG. 4C, FIG. 5A, FIG. 5B and FIG. 5C, Experimental Example 1 and Experimental Example 2 show carrier mobility properties on the holes and carrier mobility properties on electrons.

The organic magnetic semiconductor material according to embodiments may show semiconductor properties. Accordingly, the organic magnetic semiconductor material may be used as the semiconductor layer of a transistor. The semiconductor layer may play the role of a p-type channel or a n-type channel. The organic magnetic semiconductor material may be applied in various transistors without restrictions on the type of the transistor.

According to the inventive concept, the organic magnetic semiconductor material is stabilized by a resonance structure and may have a high spin density and radicals. The organic magnetic semiconductor material may have magnetic properties and semiconductor properties at the same time.

Although the embodiments of the present invention have been described, it is understood that the present invention should not be limited to the embodiments, but various changes and modifications can be made by one ordinary skilled in the art within the spirit and scope of the present invention as hereinafter claimed.

What is claimed is:

1. An organic magnetic material comprising a material represented by the following Formula 1:

[Formula 1]

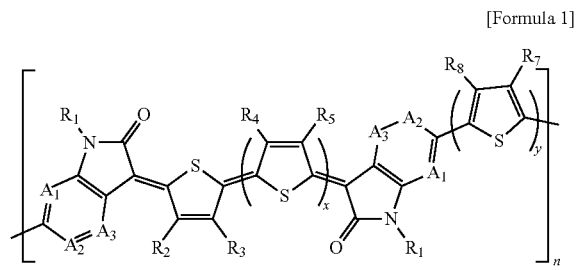

in Formula 1, $A_1$, $A_2$, and $A_3$ are each independently carbon or nitrogen, at least one of $A_1$, $A_2$, and $A_3$ is nitrogen, $R_1$ is hydrogen or an alkyl group of 1 to 50 carbon atoms, $R_2$, $R_3$, $R_4$, $R_5$, $R_6$, and $R_7$ are each independently hydrogen or an alkyl group of 1 to 3 carbon atoms, x is a rational number between 0 to 2, y is a rational number between 0 to 4, and n is an integer between 10 and 10000000.

2. The organic magnetic material of claim 1, wherein the material represented by Formula 1 is ferromagnetic.

3. The organic magnetic material of claim 1, wherein, in Formula 1, $A_1$ is nitrogen.

4. The organic magnetic material of claim 1, wherein, in Formula 1, $R_1$ is an alkyl group of 5 to 50 carbon atoms.

5. The organic magnetic material of claim 1, wherein, in Formula 1, x is 1 or 2.

6. The organic magnetic material of claim 1, wherein, in Formula 1, y is 0 or 1.

7. The organic magnetic material of claim 1, wherein the material represented by Formula 1 comprises a material represented by the following Formula 2:

[Formula 2]

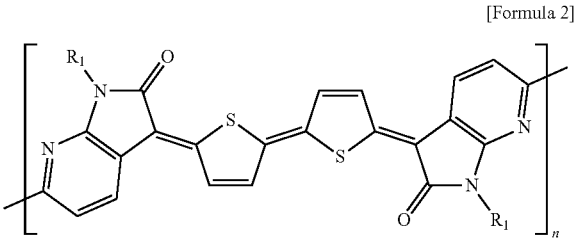

in Formula 2, $R_1$ is hydrogen or an alkyl group of 1 to 50 carbon atoms, and n is an integer between 10 and 10000000.

8. The organic magnetic material of claim 1, wherein the material represented by Formula 1 comprises a material represented by the following Formula 3:

[Formula 3]

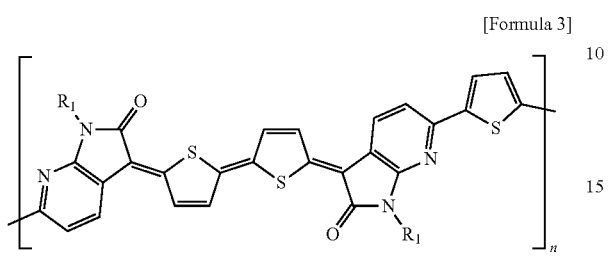

in Formula 3, $R_1$ is hydrogen or an alkyl group of 1 to 50 carbon atoms, and n is an integer between 10 and 10000000.

9. The organic magnetic material of claim 1, wherein the material represented by Formula 1 is a semiconductor material.

10. A semiconductor device, comprising:
 a substrate;
 source/drain patterns on the substrate;
 a semiconductor layer disposed between the source/drain patterns and comprising the organic magnetic material according to claim 1;
 a gate pattern provided on the semiconductor layer and spaced apart from the semiconductor layer; and
 a gate insulating layer between the semiconductor layer and the gate pattern.

* * * * *